US011557968B2

(12) United States Patent
Teh

(10) Patent No.: US 11,557,968 B2
(45) Date of Patent: Jan. 17, 2023

(54) POWER SUPPLY CIRCUIT CAPABLE OF STABLE OPERATION

(71) Applicants: Kabushiki Kaisha Toshiba, Tokyo (JP); Toshiba Electronic Devices & Storage Corporation, Tokyo (JP)

(72) Inventor: Chen Kong Teh, Ota Tokyo (JP)

(73) Assignees: KABUSHIKI KAISHA TOSHIBA, Tokyo (JP); TOSHIBA ELECTRONIC DEVICES & STORAGE CORPORATION, Tokyo (JP)

( * ) Notice: Subject to any disclaimer, the term of this patent is extended or adjusted under 35 U.S.C. 154(b) by 30 days.

(21) Appl. No.: 17/184,883

(22) Filed: Feb. 25, 2021

(65) Prior Publication Data

US 2022/0094265 A1  Mar. 24, 2022

(30) Foreign Application Priority Data

Sep. 23, 2020  (JP) .............................. JP2020-158413

(51) Int. Cl.
| H02M 3/156 | (2006.01) |
| H03K 3/023 | (2006.01) |
| H03G 3/00 | (2006.01) |
| H02M 1/42 | (2007.01) |
| H02M 3/335 | (2006.01) |
| H02M 1/00 | (2006.01) |

(52) U.S. Cl.
CPC ......... *H02M 3/156* (2013.01); *H02M 1/4208* (2013.01); *H02M 3/33515* (2013.01); *H03G 3/00* (2013.01); *H03K 3/023* (2013.01); *H02M 1/0025* (2021.05); *H02M 1/4283* (2021.05)

(58) Field of Classification Search
None
See application file for complete search history.

(56) References Cited

U.S. PATENT DOCUMENTS

| 6,246,221 B1 * | 6/2001 | Xi ............................ G05F 1/575 |
| | | 323/280 |
| 6,570,368 B2 * | 5/2003 | Demizu ................. H02M 3/156 |
| | | 323/351 |
| 6,600,299 B2 * | 7/2003 | Xi ............................ G05F 1/575 |
| | | 323/280 |
| 6,686,728 B2 * | 2/2004 | Nakajima ............... G05F 1/575 |
| | | 323/275 |
| 9,190,973 B2 * | 11/2015 | Zhou .................... H03G 3/3026 |
| 10,571,945 B2 * | 2/2020 | Pishdad .................. G05F 1/575 |
| 10,707,754 B2 * | 7/2020 | Takenaka ............... H02M 3/156 |

FOREIGN PATENT DOCUMENTS

| JP | 2005-184962 A | 7/2005 |
| JP | 2006-094656 A | 4/2006 |
| JP | 2007-135277 A | 5/2007 |

* cited by examiner

*Primary Examiner* — Jeffrey A Gblende
(74) *Attorney, Agent, or Firm* — Allen & Overy LLP

(57) ABSTRACT

According to one embodiment, a power supply circuit includes a smoothing capacitor that is charged with a charge current from an output transistor and outputs a voltage as an output voltage; a control loop that controls a conduction state of the output transistor depending on a difference value between the output voltage and a reference voltage; and a gain adjustment circuit that adjusts a gain of the control loop depending on magnitude of the charge current after the charge starts.

15 Claims, 6 Drawing Sheets

FIG.4
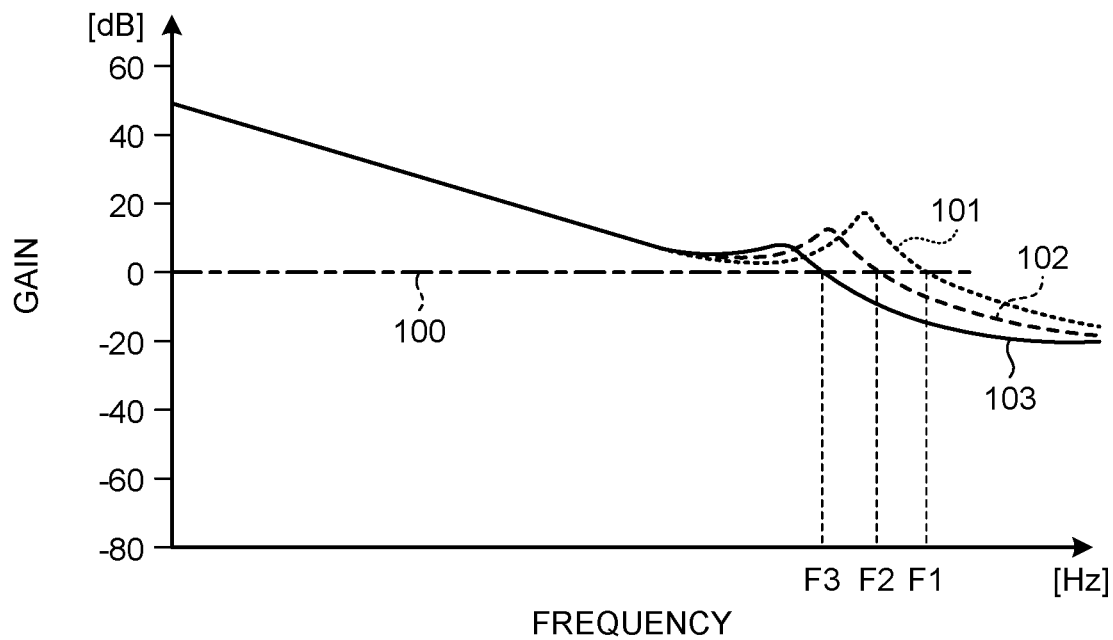
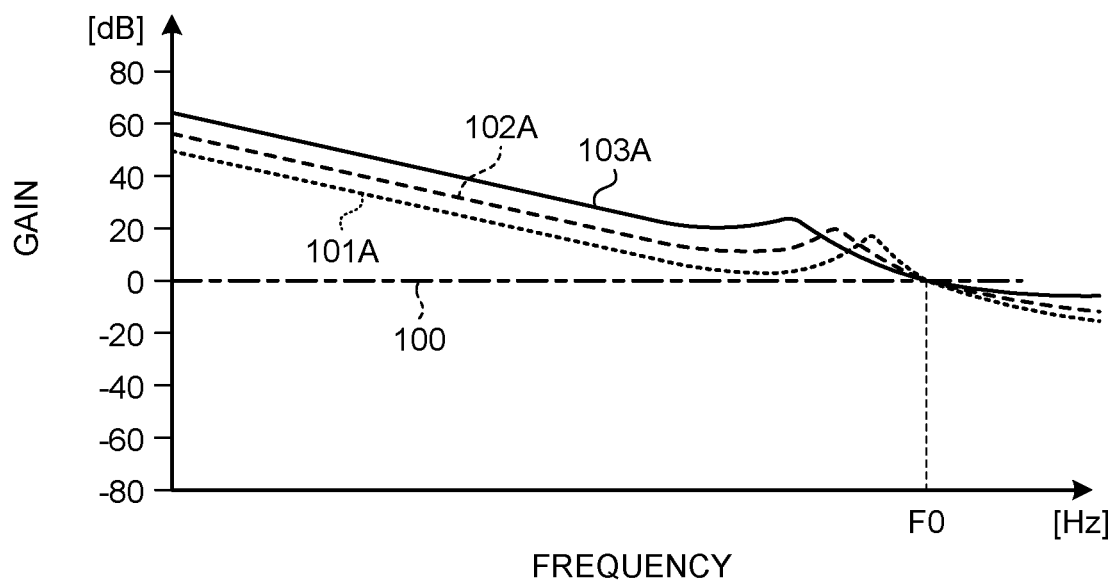

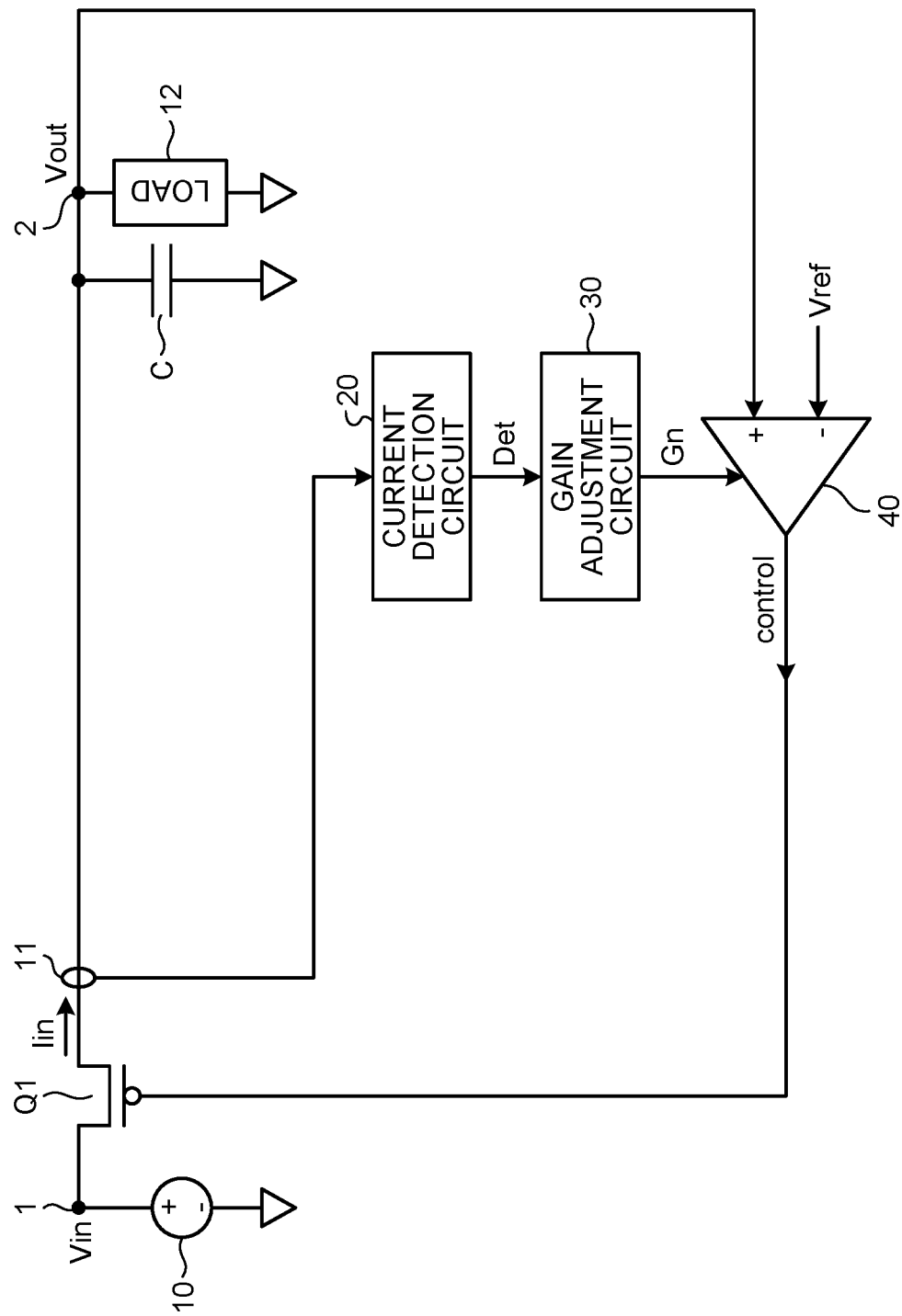

POWER SUPPLY CIRCUIT CAPABLE OF STABLE OPERATION

CROSS-REFERENCE TO RELATED APPLICATIONS

This application is based upon and claims the benefit of priority from Japanese Patent Application No. 2020-158413, filed on Sep. 23, 2020; the entire contents of which are incorporated herein by reference.

FIELD

Embodiments described herein relate generally to a power supply circuit.

BACKGROUND

Conventionally, a technique of a power supply circuit of adjusting an on-duty ratio of an output transistor by a control loop and controlling charge of a smoothing capacitor to adjust an output voltage has been disclosed. Load responsiveness changes depending on a capacitance value of the smoothing capacitor. If the capacitance value of the smoothing capacitor is high, circuit operation is stable, but the load responsiveness is slow. On the other hand, if the capacitance value of the smoothing capacitor is low, load responsiveness is fast, but a problem of oscillation occurs, and a configuration to avoid the oscillation is therefore required. A power supply circuit which carries out stable operation without depending on the capacitance value of the smoothing capacitor is desired.

BRIEF DESCRIPTION OF THE DRAWINGS

FIG. 4 is a diagram for describing effects of the gain adjustment of the control loop;

FIG. 8 is a diagram illustrating a configuration of a power supply circuit of a third embodiment.

DETAILED DESCRIPTION

In general, according to one embodiment, a power supply circuit includes a smoothing capacitor that is charged with a charge current from an output transistor and outputs a voltage generated by the charge as an output voltage; a control loop that controls a conduction state of the output transistor depending on a difference value between the output voltage and a reference voltage; and a gain adjustment circuit that adjusts a gain of the control loop depending on the value of the charge current after the charge of the smoothing capacitor with the charge current starts or a changed amount of the output voltage when the charge current is changed.

Hereinafter, with reference to accompanying drawings, the power supply circuit according to the embodiment will be described in detail. Note that these embodiments do not limit the present invention.

First Embodiment

Figure 1:
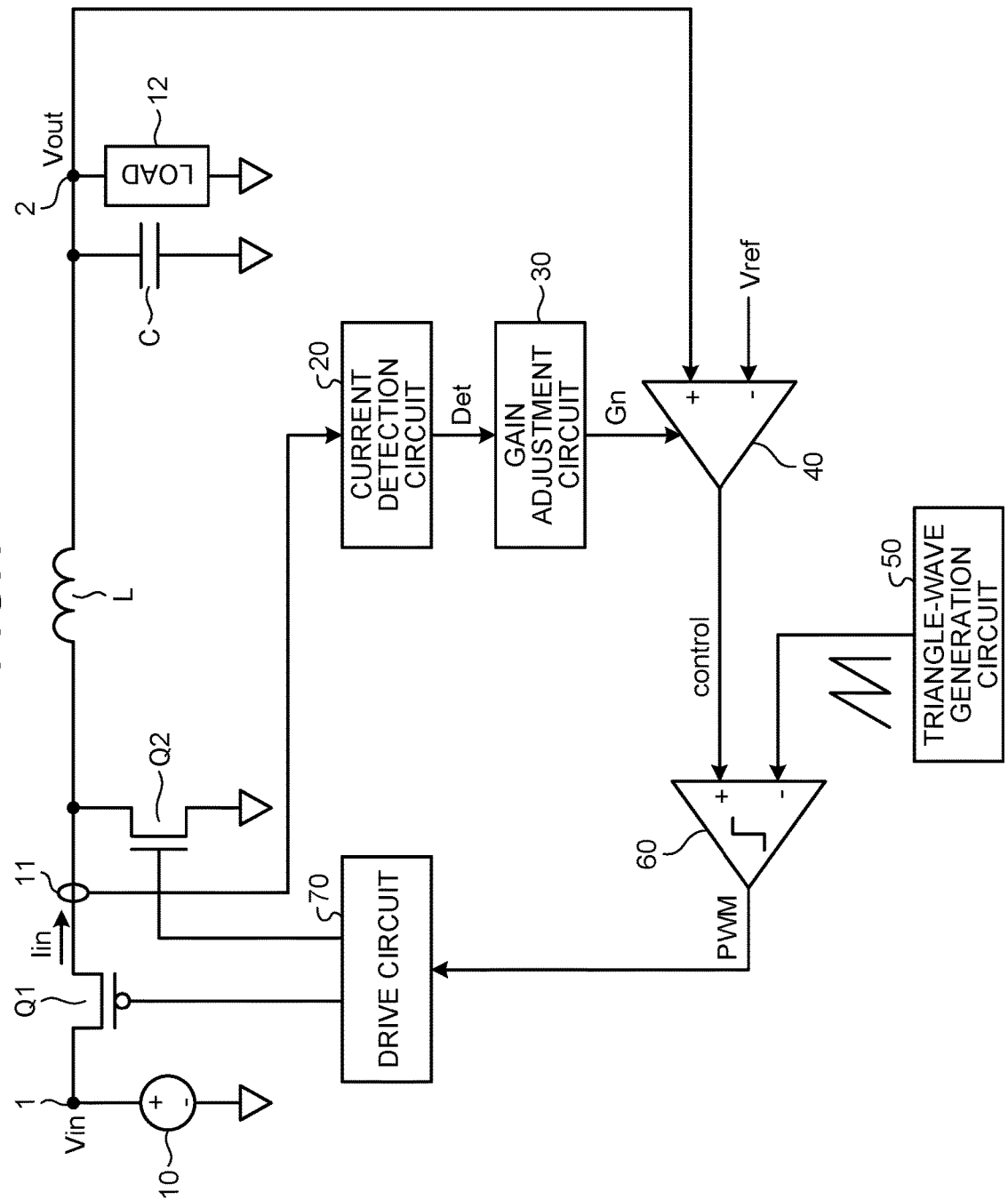
FIG. 1 is a diagram illustrating a configuration of a power supply circuit of a first embodiment.

FIG. 1 is a diagram illustrating a configuration of a power supply circuit of a first embodiment. The present embodiment has a direct-current voltage source 10. The direct-current voltage source 10 supplies an input voltage Vin to an input terminal 1. The present embodiment has output transistors Q1 and Q2. The output transistor Q1 has a source connected to the input terminal 1 and has a drain connected to one end of the inductor L. The output transistor Q2 has a drain connected to the drain of the output transistor Q1 and the one end of the inductor L and has a source, which is grounded. The output transistors Q1 and Q2 are alternately turned on/off in response to drive signals from a drive circuit 70 to control a conduction state. The first embodiment constitutes a DC/DC converter of a switching power supply circuit.

Another end of the inductor L is connected to one end of a smoothing capacitor C. Another end of the smoothing capacitor C is grounded. The smoothing capacitor C is charged with a current supplied from the inductor L. A charge voltage of the smoothing capacitor C, in other words, the voltage of the one end of the smoothing capacitor C is supplied to the output terminal 2 as an output voltage Vout. The output voltage Vout is applied to a load 12.

The present embodiment has a control loop which carries out control of causing the output voltage Vout to be equal to a reference voltage Vref. The control loop has an error amplifier 40 and a comparison circuit 60. The error amplifier 40 compares the output voltage Vout with the reference voltage Vref and outputs a control signal control, which depends on a difference value thereof. If the output voltage Vout becomes higher than the reference voltage Vref, the level of the control signal control becomes high; and, if the output voltage Vout becomes lower than the reference voltage Vref, the level of the control signal control becomes low.

The comparison circuit 60 compares the control signal control with a triangle wave from a triangle-wave generation circuit 50 to generate a pulse width modulation (PWM) signal PWM having an on-duty ratio, which is varied depending on the level of the control signal control, and supplies the PWM signal to the drive circuit 70. The drive circuit 70 supplies the drive signals to the output transistors Q1 and Q2 in response to the PWM signal PWM. In order to avoid a flow-through current, which is generated when the output transistors Q1 and Q2 become an on-state at the same time, the drive circuit 70 supplies the drive signals, which are provided with dead time, to gates of the output transistors Q1 and Q2.

The present embodiment has a current sensor 11, a current detection circuit 20, and a gain adjustment circuit 30. The current sensor 11 senses an input current Iin, which is output by the output transistor Q1, and supplies a signal, which depends on the input current Iin, to the current detection circuit 20. Hereinafter, for the sake of convenience, descriptions will be given on the assumption that the value of the input current Iin, which has been detected by the current sensor 11, is supplied to the current detection circuit 20 without change. Also, for the sake of convenience, the input current Iin is sometimes referred to as a charge current of the smoothing capacitor C.

The current detection circuit 20 supplies a detection signal Det, which depends on the input current Iin, to the gain adjustment circuit 30. The gain adjustment circuit 30 generates a gain adjustment signal Gn, which adjusts the gain of the error amplifier 40 depending on the detection signal Det from the current detection circuit 20, and supplies the gain adjustment signal Gn to the error amplifier 40. For example, the gain adjustment circuit 30 selects the gain adjustment signal Gn, which depends on the input current Iin, from a data table (not illustrated), and outputs the signal. The gain of the error amplifier 40 is adjusted depending on the gain adjustment signal Gn.

Figure 2:
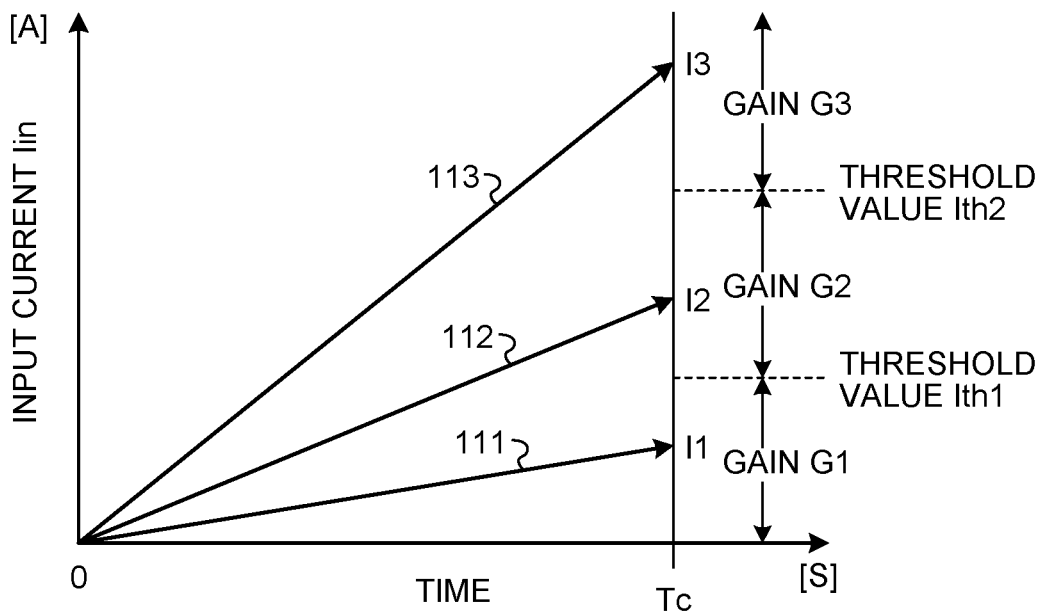
FIG. 2 is a diagram for describing a gain adjustment method of a control loop.

A method of gain adjustment of a control loop will be described by using FIG. 2. A horizontal axis of FIG. 2 illustrates time, and a vertical axis illustrates the input current Iin. Upon start-up of the power supply circuit, the charge voltage of the smoothing capacitor C, i.e., the output voltage Vout is zero. When the power supply circuit starts up and turns on the output transistor Q1, charging to the smoothing capacitor C is started. The input current Iin at this point becomes the value corresponding to the difference voltage between the input voltage Vin and the output voltage Vout, which is the charge voltage of the smoothing capacitor C.

If the value of the smoothing capacitor C is large, the rise of the output voltage Vout becomes slow since charging the smoothing capacitor C requires time. Therefore, upon start-up, the larger the capacitance value of the smoothing capacitor C, the larger the input current Iin. Therefore, as the capacitance value of the smoothing capacitor C changes from a small value to a large value, increases are made as illustrated from a solid line 111 to solid lines 112 and 113 of FIG. 2. In other words, the larger the capacitance value of the smoothing capacitor C, the larger the value of the input current Iin at detection time $T_c$. The magnitude relation of the capacitance value of the smoothing capacitor C can be detected by detecting the value of the input current Iin at the detection time $T_c$.

In the present embodiment, changes in the input current Iin caused by the differences in the capacitance value of the smoothing capacitor C are detected to adjust the gain of the control loop depending on the magnitude of the input current Iin upon start-up. Threshold values Ith1 and Ith2 are compared with the input current Iin, and the gain adjustment signal Gn depending on the comparison result thereof is supplied to the error amplifier 40 to adjust the gain of the error amplifier 40. If the input current Iin is lower than the threshold value Ith1, a gain G1 is set, and the gain adjustment signal Gn corresponding to the gain G1 is supplied to the error amplifier 40. Similarly, if the input current Iin is equal to or higher than the threshold value Ith1 and lower than the threshold value Ith2, a gain G2 is set; and, if the input current Iin is equal to or higher than the threshold value Ith2, a gain G3 is set. The gains are set from a low value to a high value in the order from the gains G1 to G3. Note that, by increasing the number of the threshold values Ithn and the number of the corresponding gain adjustment signals Gn, the detection accuracy of the capacitance value of the smoothing capacitor C can be enhanced, and fine gain adjustment of the control loop can be carried out.

Figure 3:
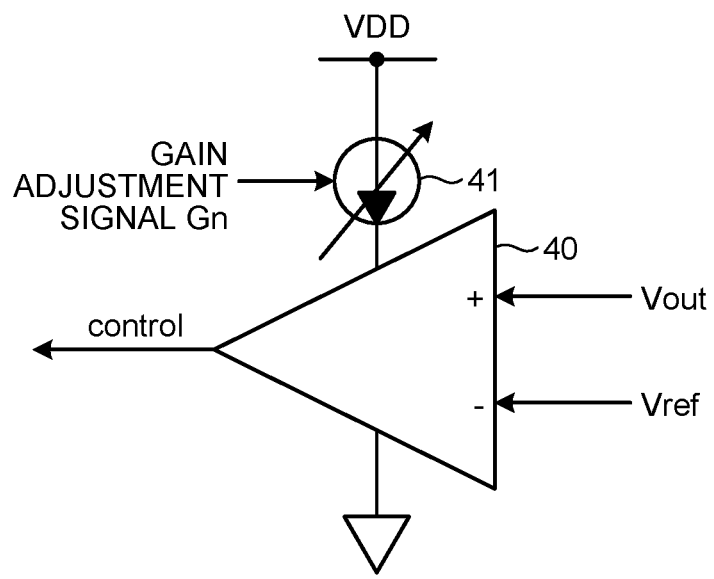
FIG. 3 is a diagram illustrating one configuration example of carrying out a gain adjustment of the control loop.

One configuration example of the gain adjustment of the error amplifier 40 will be described by using FIG. 3. The components corresponding to the already described embodiment are denoted by the same reference signs, and redundant descriptions will be given only if needed. The same applies hereinafter. In the present configuration example, the current value of a current source 41, which supplies a bias current to the error amplifier 40, is adjusted by the gain adjustment signal Gn from the gain adjustment circuit 30. The gain of the error amplifier 40 can be increased by increasing the bias current of the error amplifier 40. By increasing the gain of the error amplifier 40, the gain of the control loop can be increased, and the bandwidth of the control loop can be expanded.

Effects of the present embodiment will be described by using FIG. 4. The upper side of FIG. 4 illustrates bandwidths of the control loop before the gain adjustment is carried out. A dashed-dotted line 100 illustrates a gain 0. A broken line 101 illustrates a case in which the capacitance value of the smoothing capacitor C is the lowest. A broken line 102 illustrates a case in which the capacitance value of the smoothing capacitor C is the next lowest, and a solid line 103 illustrates a case in which the capacitance value of the smoothing capacitor C is the largest. If the capacitance value of the smoothing capacitor C is the lowest, load responsiveness is fast, a frequency F1 at which the gain is 0 is the highest, and the bandwidth of the control loop is the widest. As the capacitance value of the smoothing capacitor C increases, the frequency at which the gain becomes 0 is lowered from F2 to F3, and the bandwidth of the control loop is narrowed.

The lower part illustrates the effects brought about by the gain adjustment of the control loop of the present embodiment. The gain of the error amplifier 40 is adjusted depending on the capacitance value of the smoothing capacitor C. A broken line 101A corresponds to the broken line 101 of the upper part and illustrates a case in which the capacitance value of the smoothing capacitor C is the lowest. In this case, an adjustment is made by the gain adjustment signal Gn so that the gain of the error amplifier 40 becomes the highest. By virtue of this adjustment, the load responsiveness of the control loop becomes fast, and the frequency at which the gain becomes 0 can be increased to F0. In other words, the bandwidth of the control loop can be expanded.

Similarly, the bandwidth of the control loop is adjusted by adjusting the gain of the error amplifier 40 depending on the capacitance value of the smoothing capacitor C. By virtue of this adjustment, for example, regardless of the capacitance value of the smoothing capacitor C, an adjustment to expand the frequency, which indicates the bandwidth, to F0 can be carried out with respect to all the capacitance values of the smoothing capacitor C. The adjustment to cause the bandwidth of the control loop to be the same regardless of the capacitance value of the smoothing capacitor C can be carried out by detecting the input current Iin upon start-up and automatically adjusting the gain of the control loop. By virtue of this adjustment, the power supply circuit which carries out stable operation without depending on the capacitance value of the smoothing capacitor C of the power supply circuit can be provided. The power supply circuit which carries out stable operation, for example, in a case in which the capacitance value of the smoothing capacitor C is changed in response to a request of a user or due to a time-dependent change can be provided.

Figure 5:
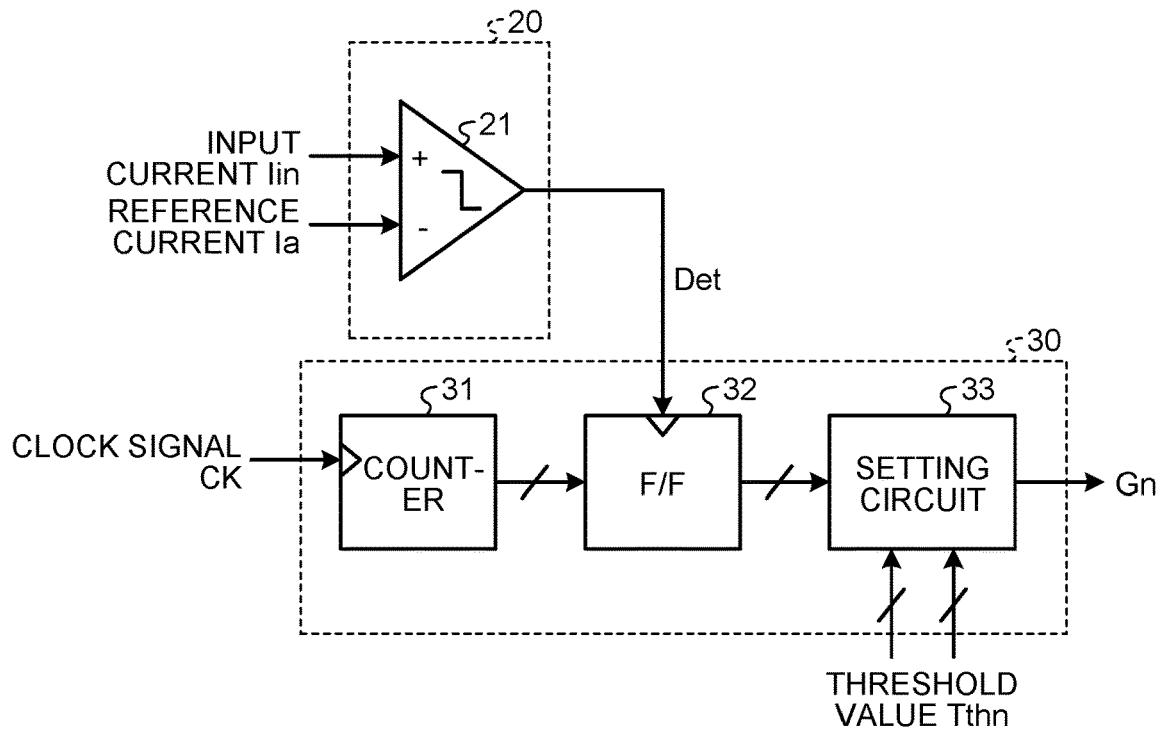
FIG. 5 is a diagram illustrating another configuration example of carrying out the gain adjustment of the control loop.

FIG. 5 is a diagram illustrating another configuration example of carrying out the gain adjustment of the control loop. The current detection circuit 20 of the present configuration has a comparison circuit 21. The comparison circuit 21 compares the input current Iin with a reference current Ia. If the input current Iin becomes higher than the reference current Ia, the comparison circuit 21 outputs the detection signal Det having a H level.

The gain adjustment circuit 30 of the present configuration has a counter 31, a flip-flop 32, and a setting circuit 33.

The counter 31 counts clock signals CK. The flip-flop 32 responds to the output of the counter 31 and the detection signal Det. The flip-flop 32 supplies the count value of the counter 31 of a point when the detection signal Det becomes the H level to the setting circuit 33. In other words, the output of the flip-flop 32 is a signal which indicates the time taken until the input current Iin reaches the reference current Ia. The setting circuit 33 compares the output of the flip-flop 32 with a threshold value Tthn. The setting circuit 33 outputs the gain adjustment signal Gn, which depends on the result of comparison between the output of the flip-flop 32 and the threshold value Tthn.

Figure 6:
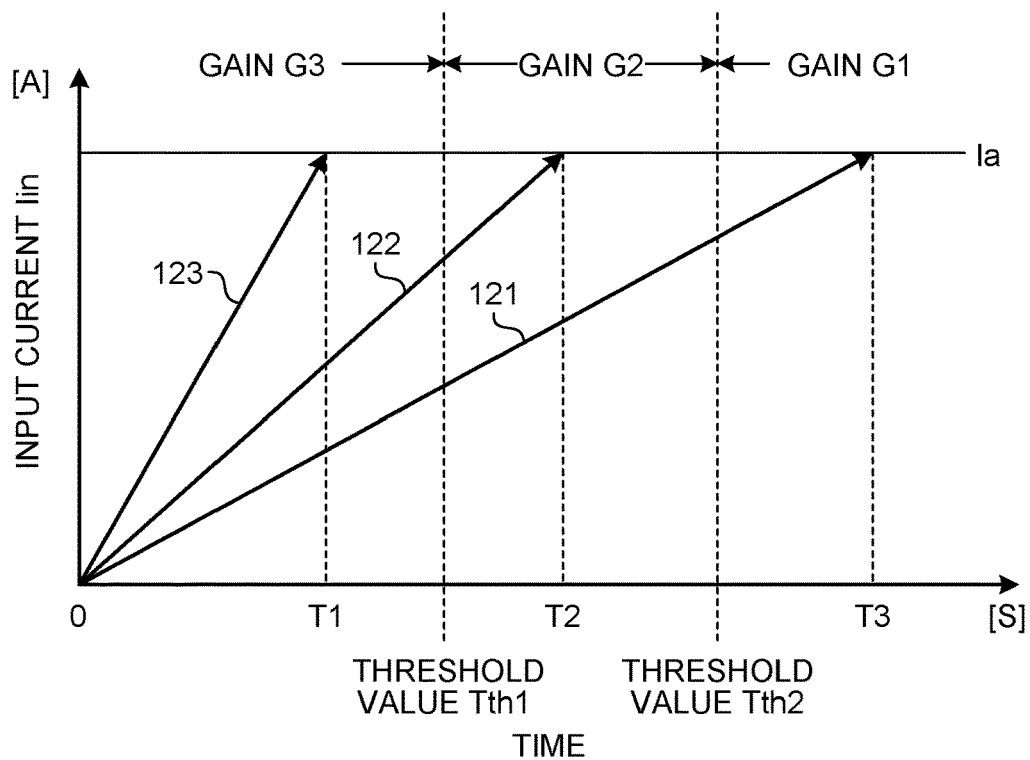
FIG. 6 is a diagram for describing another method of the gain adjustment of the control loop.

An adjustment method using the gain adjustment circuit 30 of the present configuration example will be described by using FIG. 6. The horizontal axis of FIG. 6 illustrates time, and the vertical axis illustrates the input current Iin. The timing at which the input current Iin reaches the reference current Ia is detected by the comparison circuit 21. The signal depending on the time taken until the input current Iin reaches the reference current Ia is output from the flip-flop 32 and is compared with the threshold value Tthn in the setting circuit 33. If the capacitance value of the smoothing capacitor C is large, the input current Iin upon start-up becomes high; therefore, time T1 taken until the input current Iin reaches the reference current Ia is short as illustrated by a solid line 123.

The lower the capacitance value of the smoothing capacitor C, the lower the input current Iin upon start-up, and time T2 and T3 taken until the input current Iin reaches the reference current Ia becomes longer as illustrated by solid lines 122 and 121. Therefore, the magnitude relation of the capacitance value of the smoothing capacitor C can be detected by detecting the input current Iin upon start-up of the power supply circuit and detecting the time T1, T2, and T3, which is taken until the input current Iin reaches the reference current Ia.

If the time T3, which is taken until the input current Iin reaches the reference current Ia, is equal to or higher than a threshold value Tth2, a gain G1 having a lowest gain is selected. If the time T2, which is taken until the input current Iin reaches the reference current Ia, is shorter than the threshold value Tth2 and is equal to or higher than a threshold value Tth1, a gain G2 is selected. If the time T1, which is taken until the input current Iin reaches the reference current Ia, is shorter than the threshold value Tth1, a gain G3 having a highest gain is selected. The gain of the error amplifier 40 is adjusted depending on the gains G1 to G3.

By virtue of this adjustment, an adjustment to increase the gain of the error amplifier 40 is carried out if the capacitance value of the smoothing capacitor C is high. Therefore, the gain of the control loop including the error amplifier 40 becomes high, and the load responsiveness becomes fast. By virtue of this, the bandwidth of the control loop can be expanded. The power supply circuit which automatically adjusts the gain of the control loop depending on the magnitude of the capacitance value of the smoothing capacitor C and automatically adjusts the bandwidth of the control loop is formed.

Second Embodiment

Figure 7:
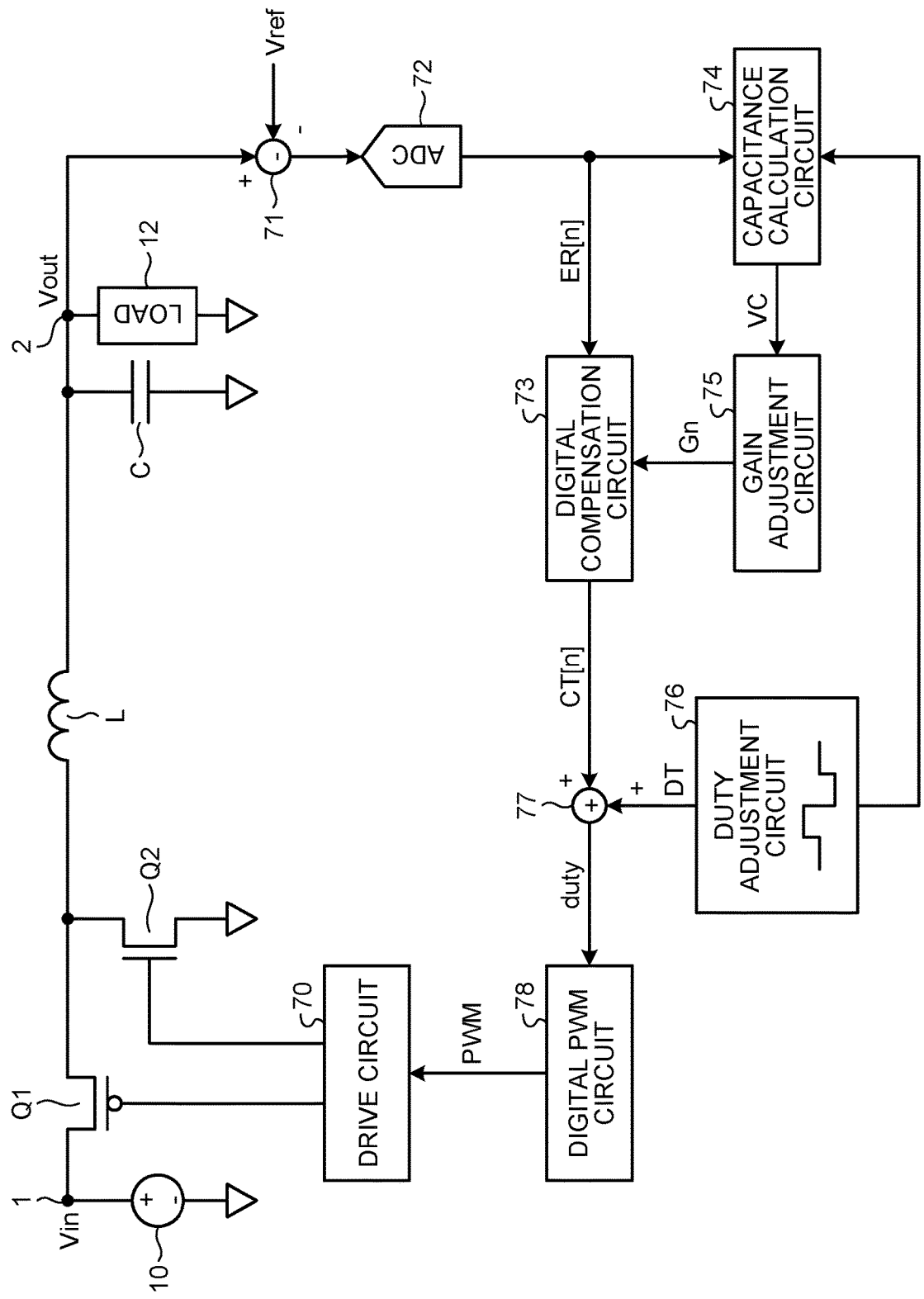
FIG. 7 is a diagram illustrating a configuration of a power supply circuit of a second embodiment.

FIG. 7 is a diagram illustrating a configuration of a power supply circuit of a second embodiment. A control loop of the present embodiment has a subtraction circuit 71. The subtraction circuit 71 outputs an output signal, which depends on the difference value of the output voltage Vout and the reference voltage Vref. The subtraction circuit 71 includes, for example, a differential amplifier circuit. The output signal of the subtraction circuit 71 is supplied to an A/D converter 72. As the A/D converter 72, an A/D converter of various types such as a successive-approximation-type A/D converter and a flash-type A/D converter can be used.

The A/D converter 72 outputs an error value ER[n] of a digital signal depending on the output signal of the subtraction circuit 71. The error value ER[n] is supplied to a digital compensation circuit 73.

The digital compensation circuit 73 receives the error value ER[n], which is output from the A/D converter 72, calculates a control value CT[n] for controlling proportional integral derivative (PID) control by PID computation so that the output voltage Vout becomes equal to the reference voltage Vref, and outputs the control value.

The control value CT[n] output from the digital compensation circuit 73 is represented, for example, by a following equation (1).

$$CT[n]=CT[n-1]+K1\times ER[n]+K2\times ER[n-1]+K3\times[n-2]+K4\times ER[n-3] \quad (1)$$

Herein, ER represents the error value, and K1, K2, K3, and K4 represent compensation coefficients. Also, [n] represents the current value, [n−1] represents the value of an immediately-before switching cycle, [n−2] represents the value of two switching cycles before, and [n−3] represents the value of three switching cycles before. The control value CT[n] of the digital compensation circuit 73 is supplied to an adder circuit 77.

The present embodiment has a capacitance calculation circuit 74, a gain adjustment circuit 75, and a duty adjustment circuit 76. The duty adjustment circuit 76 generates an adjustment signal DT, which changes the duty ratio of the PWM signal, and supplies the adjustment signal DT to the adder circuit 77.

Based on a varied amount of the error value ER[n], the capacitance calculation circuit 74 generates a calculation signal VC, which depends on the capacitance value of the smoothing capacitor C. If the capacitance value of the smoothing capacitor C is high, a changed amount of the output voltage Vout with respect to a change in a duty instruction signal duty is small. The capacitance calculation circuit 74 calculates the degree of a change in the output voltage Vout, which is caused when the duty instruction signal duty is changed, generates the calculation signal VC, which depends on the capacitance value of the smoothing capacitor C, in accordance with the magnitude thereof, and outputs the calculation signal VC. The information indicating that the duty ratio has been adjusted is supplied from the duty adjustment circuit 76 to the capacitance calculation circuit 74.

The duty instruction signal duty, which is the control value CT[n] and the adjustment signal DT added in the adder circuit 77, is supplied to a digital PWM circuit 78. The digital PWM circuit 78 generates a PWM signal PWM in response to the duty instruction signal duty and supplies the signal to the drive circuit 70.

In accordance with the adjustment signal DT from the duty adjustment circuit 76, the on-duty ratio of the PWM signal PWM is changed, and the on-time of the output transistors Q1 and Q2 is changed. Since the on-time of the output transistors Q1 and Q2 is changed, the output voltage Vout is changed. Therefore, the difference value between the output voltage Vout and the reference voltage Vref is changed, and the error value ER[n] supplied from the A/D converter 72 to the capacitance calculation circuit 74 is changed.

The gain adjustment circuit 75 compares the calculation signal VC from the capacitance calculation circuit 74 with threshold values (not illustrated) set in advance, selects the gain adjustment signal Gn, which depends on the comparison result, from a data table (not illustrated) and supplies the signal to the digital compensation circuit 73. The compensation coefficients K1, K2, K3, and K4 of the digital compensation circuit 73 are adjusted by the gain adjustment signal Gn.

If it is detected that the capacitance value of the smoothing capacitor C is low, an adjustment of reducing the compensation coefficients K1, K2, K3, and K4 is carried out. If it is detected that the capacitance value is large, an adjustment to increase the compensation coefficients K1, K2, K3, and K4 is carried out. The gain of the digital compensation circuit 73 is adjusted by adjusting the compensation coefficients K1, K2, K3, and K4, and the gain of the control loop is adjusted. In other words, since the gain of the control loop can be adjusted depending on the capacitance value of the smoothing capacitor C, for example, an adjustment of causing the bandwidth of the control loop to be constant can be carried out regardless of the capacitance value of the smoothing capacitor C. Note that the adjustment of the compensation coefficients of the digital compensation circuit 73 does not have to include all the compensation coefficients K1 to K4, and, for example, only the compensation coefficient K1 may be adjusted.

According to the present embodiment, the magnitude of the capacitance value of the smoothing capacitor C is calculated by intentionally changing the on-duty ratios of the output transistors Q1 and Q2 and detecting the changed amount in the output voltage Vout generated by the change, and the gain of the control loop including the digital compensation circuit 73 is adjusted based on the calculation result. Since the gain of the control loop is adjusted depending on the capacitance value of the smoothing capacitor C, the power supply circuit which carries out stable operation regardless of the capacitance value of the smoothing capacitor C is provided. Also, since the gain of the digital compensation circuit 73 is digitally adjusted, the gain adjustment of the control loop in the present embodiment is not easily affected by noise, etc. Also, since the present embodiment carries out the control based on the changed amount in the output voltage Vout, the current sensor 11 and the current detection circuit 20, which have already been described, can be omitted. Note that the adjustment of the on-duty ratio by the duty adjustment circuit 76 can be carried out when an operation state is stable after start-up of the power supply circuit.

Third Embodiment

FIG. 8 is a diagram illustrating a configuration of a power supply circuit of a third embodiment. As well as the first embodiment, the present embodiment has the error amplifier 40 which compares the output voltage Vout with the reference voltage Vref and outputs the control signal control depending on the difference output thereof. The error amplifier 40 constitutes a control loop which adjusts the conduction state of the output transistor Q1 so that the output voltage Vout becomes equal to the reference voltage Vref. If the output voltage Vout becomes higher than the reference voltage Vref, the level of the control signal control output by the error amplifier 40 becomes high; and, if the output voltage Vout becomes lower than the reference voltage Vref, the level of the control signal control becomes low. The conduction state of the output transistor Q1 is controlled since the gate voltage of the output transistor Q1 of a P-channel-type is changed depending on the level of the control signal control to carry out the control to cause the output voltage Vout to be equal to the reference voltage Vref.

The gain of the error amplifier 40 is adjusted by the gain adjustment signal Gn from the gain adjustment circuit 30. A configuration of comparing the input current Iin upon start-up with the threshold values Ith1 and Ith2 and generating the gain adjustment signal Gn depending on the result thereof can have a configuration similar to that of the first embodiment.

The present embodiment constitutes a so-called linear regulator, which controls the conduction state of the output transistor Q1 and causes the output voltage Vout to be equal to the reference voltage Vref. The bandwidth of the control loop can be automatically adjusted by automatically adjusting the gain of the error amplifier 40, which constitutes the control loop, depending on the capacitance value of the smoothing capacitor C. Therefore, the power supply circuit which carries out stable operation without depending on the capacitance value of the smoothing capacitor C can be provided.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A power supply circuit comprising:
   a smoothing capacitor that is charged with a charge current from an output transistor and outputs a voltage generated by the charge as an output voltage;
   a control loop that controls a conduction state of the output transistor depending on a difference value between the output voltage and a reference voltage; and
   a gain adjustment circuit that adjusts a gain of the control loop depending on magnitude of the charge current after the charge of the smoothing capacitor with the charge current starts, wherein
   the gain adjustment circuit adjusts the gain of the control loop depending on a value of the charge current at a point in time that is after a predetermined time from a point of time of the start of the charge, and
   the gain adjustment circuit adjusts the gain of the control loop depending on a comparison result of comparing a value of the charge current at the point in time that is after the predetermined time from a point in time of the start of the charge with a predetermined threshold value.

2. A power supply circuit comprising:
   a smoothing capacitor that is charged with a charge current from an output transistor and outputs a voltage generated by the charge as an output voltage;
   a control loop that controls a conduction state of the output transistor depending on a difference value between the output voltage and a reference voltage; and
   a gain adjustment circuit that adjusts a gain of the control loop depending on magnitude of the charge current after the charge of the smoothing capacitor with the charge current starts, wherein
the gain adjustment circuit adjusts the gain of the control loop depending on time taken from start of the charge until the charge current reaches a predetermined set value, and
the gain adjustment circuit adjusts the gain of the control loop depending on a comparison result of comparing time taken from the time of the start of the charge until the charge current reaches a predetermined set value with a predetermined threshold value.

3. The power supply circuit according to claim 1, wherein
the control loop has an error amplifier that compares the output voltage with the reference voltage, and
the gain adjustment circuit adjusts a gain of the error amplifier.

4. The power supply circuit according to claim 2, wherein
the control loop has an error amplifier that compares the output voltage with the reference voltage, and
the gain adjustment circuit adjusts a gain of the error amplifier.

5. The power supply circuit according to claim 3, wherein
the gain adjustment circuit adjusts a bias current of the error amplifier to adjust the gain of the error amplifier.

6. The power supply circuit according to claim 1, wherein
the control loop has
a signal generation circuit that generates a PWM signal having an adjusted duty ratio depending on an output signal of the error amplifier, and
a drive circuit that generates a drive signal depending on an output signal of the signal generation circuit and supplies the drive signal to the output transistor.

7. The power supply circuit according to claim 3, wherein
the control loop supplies an output signal of the error amplifier to a gate of the output transistor.

8. A power supply circuit comprising:
a smoothing capacitor that is charged with a charge current from an output transistor and outputs a voltage generated by the charge as an output voltage;
a control loop that controls a conduction state of the output transistor depending on a difference value between the output voltage and a reference voltage; and
a gain adjustment circuit that adjusts a gain of the control loop depending on a changed amount in the output voltage after an on-duty ratio of the output transistor is changed, wherein
the control loop has
an AD conversion circuit that converts the difference value between the output voltage and the reference voltage to a digital signal, and
a digital compensation circuit that generates a control signal depending on an output signal of the AD conversion circuit, and
the gain adjustment circuit adjusts a compensation coefficient of the digital compensation circuit.

9. The power supply circuit according to claim 8, wherein
the gain adjustment circuit carries out an adjustment of increasing the compensation coefficient of the digital compensation circuit if the changed amount in the output voltage is low.

10. The power supply circuit according to claim 8, wherein
the control loop has
a duty adjustment circuit that generates a signal that adjusts the on-duty ratio,
an adder circuit that adds an output signal of the digital compensation circuit and an output signal of the duty adjustment circuit,
a PWM signal generation circuit that generates a PWM signal in response to an output signal of the adder circuit, and
a drive circuit that generates a drive signal depending on an output signal of the PWM signal generation circuit and supplies the drive signal to the output transistor.

11. A power supply circuit comprising:
an output transistor having a main current path, the main current path having one end to which an input voltage is applied and having another end that outputs a charge current;
a smoothing capacitor that is charged with the charge current and outputs a voltage generated by the charge as an output voltage;
a current detection circuit that detects the charge current;
a control loop having an error amplifier that outputs a difference value between the output voltage and a reference voltage; and
a gain adjustment circuit that adjusts the error amplifier depending on a change in the charge current after the charge of the smoothing capacitor with the charge current starts,
wherein the gain adjustment circuit adjusts the gain of the control loop by comparing a value of the charge current at a point in time that is after a predetermined time from a point in time of the start of the charge with a predetermined threshold value and selecting a gain associated with a result of the comparison.

12. The power supply circuit according to claim 11, wherein
the gain adjustment circuit adjusts the gain of the control loop by comparing time taken from start of the charge until the charge current reaches a predetermined set value with a predetermined threshold value and selecting a gain associated with a result of the comparison.

13. The power supply circuit according to claim 11, wherein
the gain adjustment circuit adjusts a bias current of the error amplifier to adjust the gain of the error amplifier.

14. The power supply circuit according to claim 12, wherein
the gain adjustment circuit adjusts a bias current of the error amplifier to adjust the gain of the error amplifier.

15. The power supply circuit according to claim 11, wherein
the control loop has a signal generation circuit that generates a PWM signal having an adjusted on-duty ratio depending on an output signal of the error amplifier.

* * * * *